United States Patent
Yu (10) Patent No.: US 6,714,417 B2
(45) Date of Patent: Mar. 30, 2004

(54) MODULE HOLDER

(75) Inventor: Yong Cheol Yu, Gyeonggi-Do (KR)

(73) Assignee: LG Electronics Inc., Seoul (KR)

( * ) Notice: Subject to any disclaimer, the term of this patent is extended or adjusted under 35 U.S.C. 154(b) by 0 days.

(21) Appl. No.: 10/146,946

(22) Filed: May 17, 2002

(65) Prior Publication Data

US 2002/0186547 A1 Dec. 12, 2002

(30) Foreign Application Priority Data

Jun. 11, 2001 (KR) ........................................ 2001-32620

(51) Int. Cl.$^7$ ................................................. H05K 5/00
(52) U.S. Cl. ........................ 361/730; 361/801; 361/802; 439/717
(58) Field of Search ................................ 361/728, 729, 361/730, 733, 797, 801, 802, 807, 825; 211/41.17; 439/594, 701, 714, 717, 631, 928

(56) References Cited

U.S. PATENT DOCUMENTS

| | | | |
|---|---|---|---|
| 4,164,362 A | | 8/1979 | Cobaugh et al. .......... 339/17 M |
| 4,401,351 A | * | 8/1983 | Record ......................... 439/61 |
| 4,501,460 A | * | 2/1985 | Sisler .......................... 361/730 |
| 4,630,175 A | * | 12/1986 | Lerude et al. ............... 361/816 |
| 4,738,632 A | | 4/1988 | Schmidt et al. ............. 439/341 |
| 4,790,762 A | * | 12/1988 | Harms, deceased et al. .......................... 361/784 |
| 4,858,070 A | * | 8/1989 | Buron et al. ................ 361/695 |
| 5,067,040 A | * | 11/1991 | Fallik .......................... 361/687 |
| 5,493,194 A | * | 2/1996 | Damiano et al. ........... 318/575 |
| 5,677,830 A | * | 10/1997 | Nogas et al. ................ 361/790 |
| 6,081,048 A | * | 6/2000 | Bergmann et al. .......... 307/147 |
| 6,147,877 A | * | 11/2000 | Strandberg et al. ......... 361/784 |
| 6,201,698 B1 | | 3/2001 | Hunter ........................ 361/704 |
| 6,210,203 B1 | | 4/2001 | Ma .............................. 439/377 |

* cited by examiner

*Primary Examiner*—David Martin
*Assistant Examiner*—Thanh S. Phan
(74) *Attorney, Agent, or Firm*—Fleshner & Kim, LLP (57) ABSTRACT

A module holder is provided which includes a first foot for supporting one side of a module, a second foot for supporting the other side of the module, and slots detachably assembled between the first foot the second foot provided as many as are necessary corresponding to the number of modules to be mounted therein. An engaging unit may be formed between the first foot and the slot, between the adjacent slots, and between the slot and the second foot, for fixing each component detachably. Since the slots are formed as single products and engaging portions are formed between the slots, so that the slots can be separated or engaged, the slots can be assembled as many as are necessary corresponding to the number of modules to be mounted and modules may be added, if necessary. Accordingly, the space of the module holder occupying equipment can be minimized, improving the space utilization of the equipment.

27 Claims, 8 Drawing Sheets

MODULE HOLDER

BACKGROUND OF THE INVENTION

1. Field of the Invention

The invention relates to a module holder.

2. Background of the Related Art

In general, various types of equipment, such as communication equipment, include circuit boards classified by their functions and in the form of modules or units electrically connected to a common bus for transmitting data. In such equipment, each module or unit required for each function is detachably mounted on/in a holder and connected to the common bus, so that the module or the unit can be easily attached or removed.

In the case of large-scale equipment, the holder is provided in the form of a rack or racks in a cabinet. Meanwhile, in the case of small-scale equipment, a module holder is used so that the equipment can be easily installed at a desk.

The module holder in accordance with a conventional art will now be described with reference to the accompanying drawings.

Figure 1:
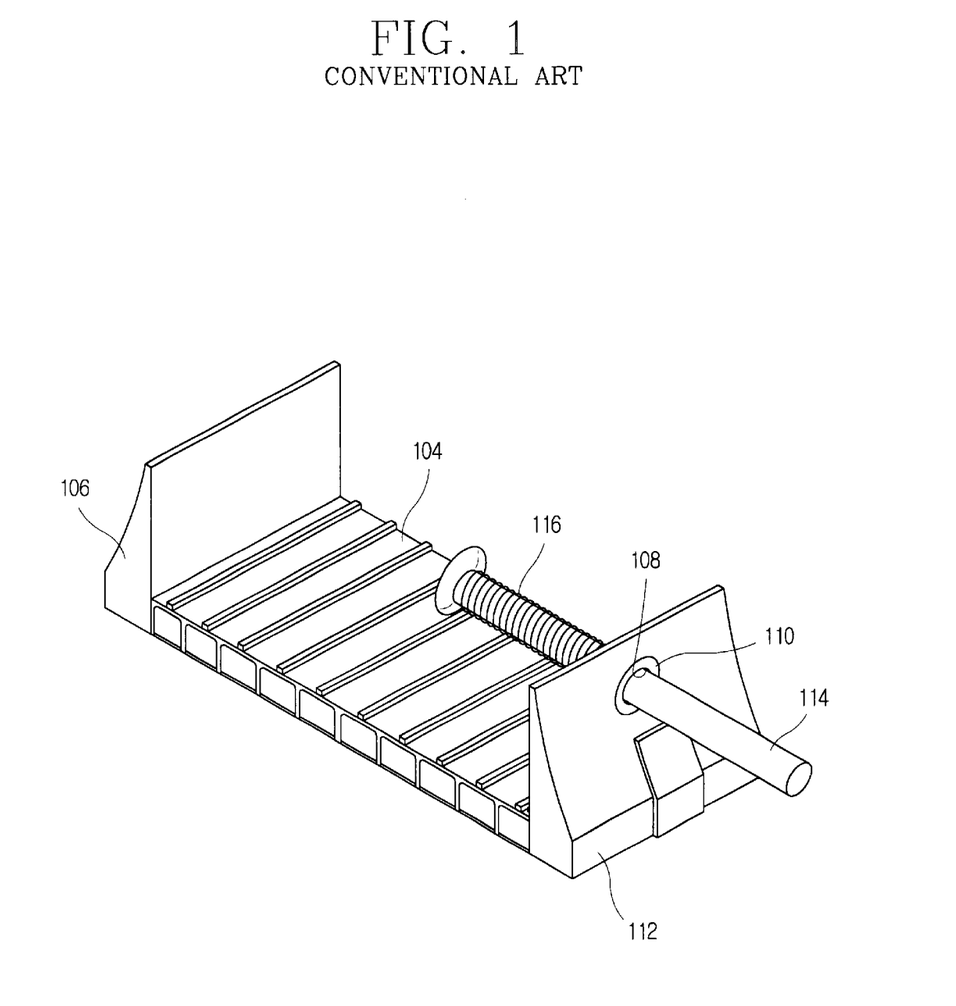
FIG. 1 is a perspective view of a conventional module holder.
Figure 2:
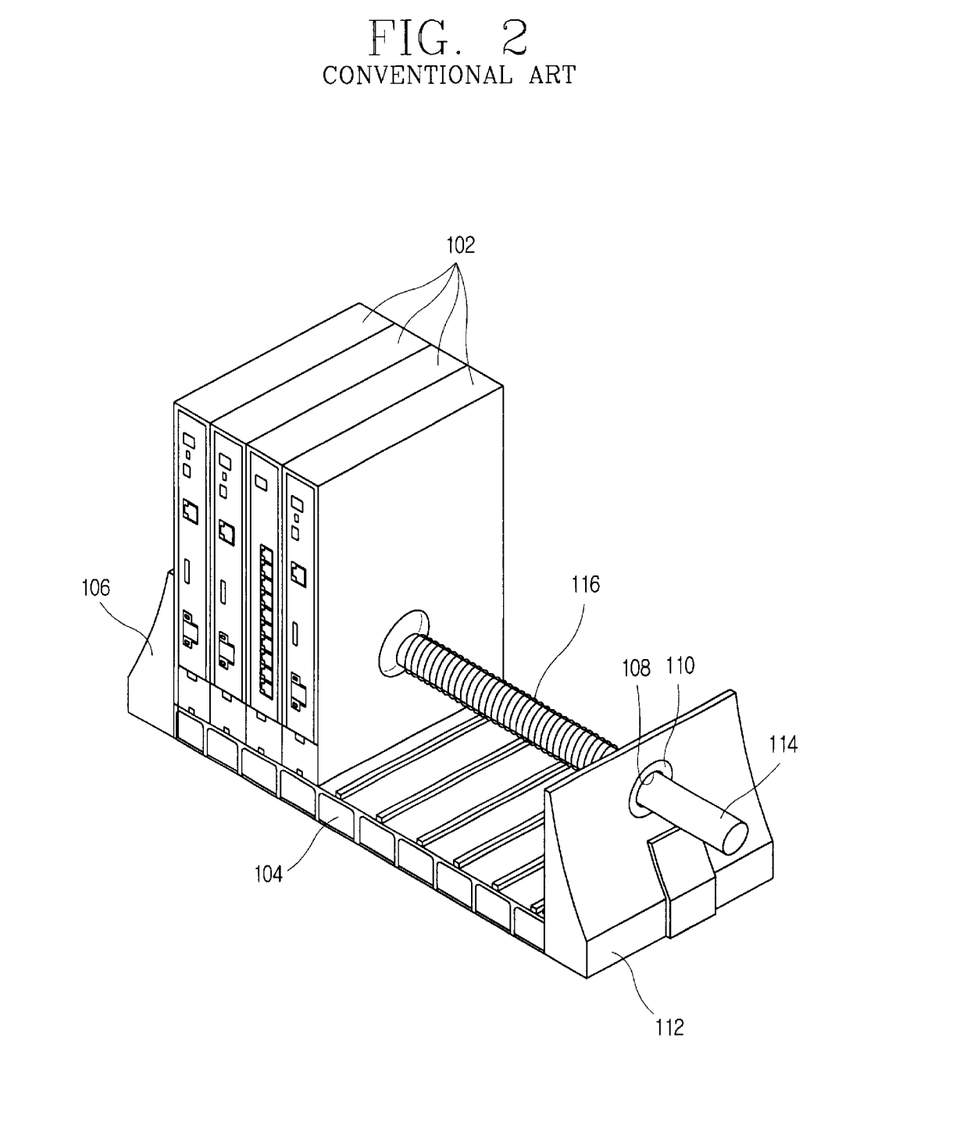
FIG. 2 is a drawing illustrating a state in which a module is mounted using the conventional module holder of FIG. 1.

FIG. 1 is a perspective view of a conventional module holder. FIG. 2 is a drawing illustrating a state in which a module is mounted using the conventional module holder of FIG. 1.

The conventional module holder includes a slot unit 104 configured to receive a plurality of modules 102 at an upper portion thereof and to be electrically connected to each of the modules. A first foot 106 is formed at one end of the slot unit 104 and extends in a vertical direction supporting one side of a module 102. A second foot 112 is formed at another end of the slot unit 104 and extends in a vertical direction. The second foot 112 has a through hole 108 at a central portion thereof. An operating rod 114 for fixing the plurality of modules 102 is linearly and movably inserted into the through hole 108 of the second foot 112 and is aligned with an upper portion of the slot unit 104. A coil spring 116 configured to be inserted between the operating rod 114 and the second foot 112 provides an elastic force that presses the operating rod 114 in the direction of the first foot 106.

The slot unit 104 is formed with a maximum size anticipating the maximum number of modules 102 to be mounted therein. The stopper 110 is integrally formed with the second foot 112, so as to prevent the operating rod 114 from releasing due to the elastic force of the coil spring 116 and to lock the position of the operating rod 114.

The operation of the module holder constructed as described above will now be explained.

FIG. 2 is a drawing illustrating a state in which a module is mounted using the conventional module holder of FIG. 1.

An adequate number of modules 102 required for construction of a system are mounted at an upper surface of the slot unit 104. That is, as many modules as are required are sequentially mounted from the first foot 106. And then, when the operating rod 114 is released from a locked position by operating the stopper 110, the operating rod 114 is linearly moved due to the elastic force of the coil spring 116 and is supported at a side of the modules 102 mounted in the slot unit 105, to thereby fix the modules 102 in place.

At this time, the operating rod 114 supports the module 102 due to the elastic force of the coil spring 116. If an external force stronger than the elastic force of the coil spring 116 is applied, the stopper 110 locks the operating rod 114 so as to prevent the modules 102 from being released.

However, the conventional module holder has the following problems. That is, the maximum number of modules to be mounted therein must be predicted in designing the pertinent equipment and the module holder must be formed to a suitable size. Thus, the equipment occupies a large amount of space, and accordingly, a space utilization of the equipment is degraded.

In addition, since the slot unit must be formed to have a maximum size so that it can hold an adequate number of modules, the slot unit is enlarged in its size and fabrication cost is increased.

The above references are incorporated by reference herein where appropriate for appropriate teachings of additional or alternative details, features and/or technical background.

SUMMARY OF THE INVENTION

An object of the invention is to solve at least the above problems and/or disadvantages and to provide at least the advantages described hereinafter.

Therefore, an object of the invention is to provide a module holder that is capable of minimizing a space occupied by the equipment, increasing a space utilization of the equipment and minimizing fabrication cost.

To achieve these and other advantages and in accordance with the purpose of the invention, as embodied and broadly described herein, a module holder according to an embodiment of the invention is provided which includes a first foot for supporting one side of a module, a second foot for supporting another side of a module, and at least one slot detachably assembled between the first foot and the second foot. The at least one slot may comprise a plurality of slots. As many slots may be provided as are modules to be detachably assembled and mounted.

In a module holder according to an embodiment of the invention, an engaging unit may be formed between the first foot and the at least one slot, and between the at least one slot and the second foot which fixes each component detachably. The engaging unit may include a first engaging portion formed on an inner side of the first foot and being detachably engaged with one side of the at least one slot, a second engaging portion formed on one side of the at least one slot and being detachably engageable with the first engaging portion, a third engaging portion formed on another side of the at least one slot, and being detachably engageable with the second foot or being engaged with the second engaging portion, and a fourth engaging portion being formed at an inner side of the second foot and being detachably engageable with the third engaging portion.

Further, the first engaging portion may include a plurality of hooks which protrude at regular intervals in a longitudinal direction at the side of the first foot which contacts the at least one slot, and engaging holes formed between the hooks. The second engaging portion may include hooks, which protrude at one side of the at least one slot, configured to engage with the engaging holes of the first engaging portion so as to be inserted into the engaging holes of the first engaging portion, and engaging holes, which are formed between the hooks, configured to engaged with the hooks of the first engaging portion so that the hooks of the first engaging portion can be inserted therein. Each hook may protrude at a right angle from the inner side of the first foot, the second foot, and both sides of the at least one slot, and may be bent at a right angle downwardly from the end portion. The engaging hole may include a large insertion portion in which the hook is inserted and a small hooking portion in which the hook is insertedly combined.

The third engaging portion may be formed having the same structure as that of the first engaging portion. The fourth engaging portion may be formed having the same structure as that of the second engaging portion.

In a module holder according to an embodiment of the invention, a position fixing unit may be provided between the first foot and the at least one slot, and between the at least one slot and the second foot, so as to fix an assembled position when they are assembled by the engaging unit. The position fixing unit may include a position fixing protrusion and position fixing groove that are configured to mate with each other when parts are assembled, provided between the first foot, the second foot, and the at least one slot.

In a module holder according to an embodiment of the invention, the first foot and the second foot may be formed in such a manner that one side which supports a module is planar and the other side is sloped gradually widening toward the bottom so as to stably support a module.

In a module holder according to an embodiment of the invention, the at least one slot may have a width at least as thick as a module to be mounted. The at least one slot may include a guide protrusion formed at an upper central portion thereof configured to guide a module as it is mounted, and a support portion, which protrudes in an upward direction from both end portions and which supports the front and rear sides of the module.

Further, in a module holder according to an embodiment of the invention in which the at least one slot comprises a plurality of slots, an engaging unit may be provided to detachably attach together the first foot and one of the plurality of slots, adjacent slots, and one of the plurality of slots and the second foot may be provided. The engaging unit may include a plurality of hooks and engaging holes formed to be mutually engaged between the first foot and a slot disposed adjacent thereto, between adjacent slots, and between the second foot and a slot disposed adjacent thereto. Each hook may protrude at a right angle from an inner side of the respective first foot, second foot, and both sides of the respective slot and is bent at a right angle downwardly from the end portion. Each engaging hole may include an insertion portion in which a hook is inserted and a hooking portion, smaller than the insertion portion, into which a hook is engaged, and is formed on an inner side of the respective first foot, second foot and both sides of the respective slot.

In a module holder according to an embodiment of the invention in which the at least one slot comprises a plurality of slots, a position fixing unit may be provided to fix an assembled position of the first foot, the second foot, and the plurality of slots when assembled. The position fixing unit may include a plurality of position fixing protrusions and a plurality of position fixing grooves that are configured to mate with one another between the respective first foot, second foot, and the respective slots to fix the assembled position of each of the parts when assembled.

In a module holder according to an embodiment of the invention in which the at least one slot comprises a plurality of slots, sides of the first foot and the second foot facing the plurality of slots may be planar so as to support a module or modules, while opposite sides of the first foot and the second foot may be sloped toward the bottom so as to stably support a module or modules. Further, each of the plurality of slots may include a guide protrusion formed at an upper central portion thereof configured to guide a module when mounted therein and a support portion configured to support front and rear side faces of a module.

Additional advantages, objects, and features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. The invention will be described in detail with reference to the drawings in which like reference numerals refer to like elements wherein.

DETAILED DESCRIPTION OF PREFERRED EMBODIMENTS

Reference will now be made in detail to the preferred embodiments of the present invention, examples of which are illustrated in the accompanying drawings.

Figure 3:
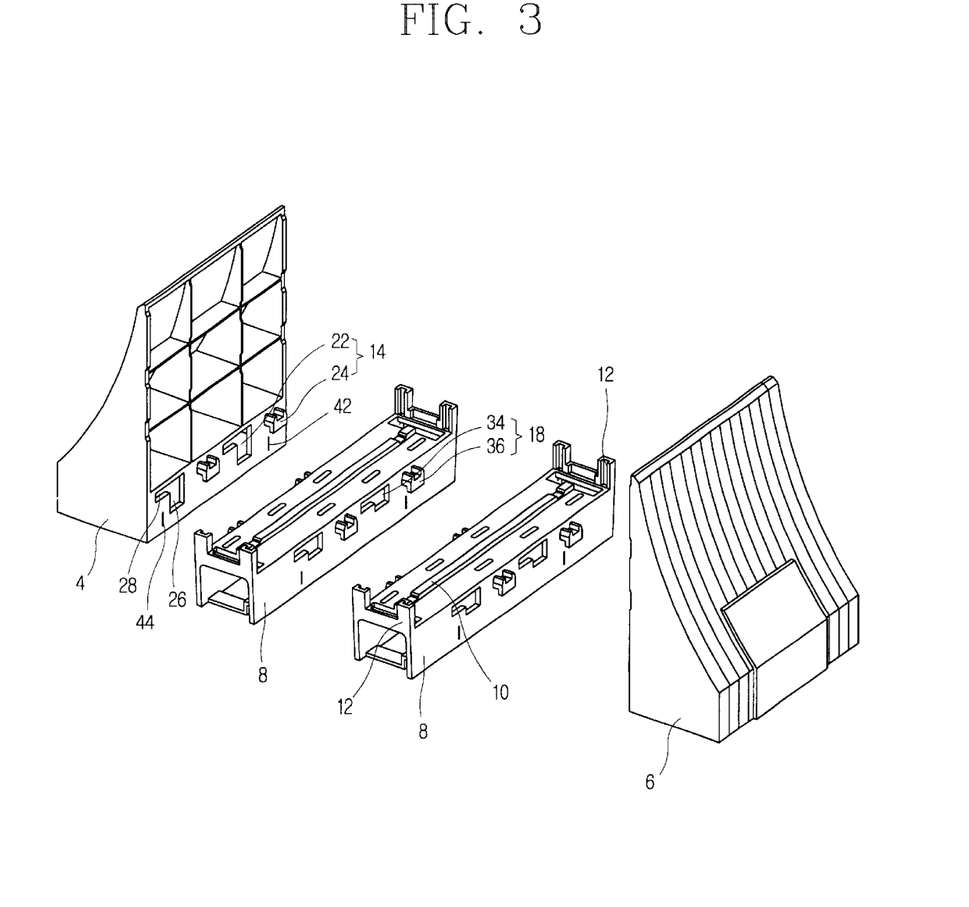
FIG. 3 is an exploded perspective view viewed from the left side of a module holder in accordance with an embodiment of the invention.
Figure 4:
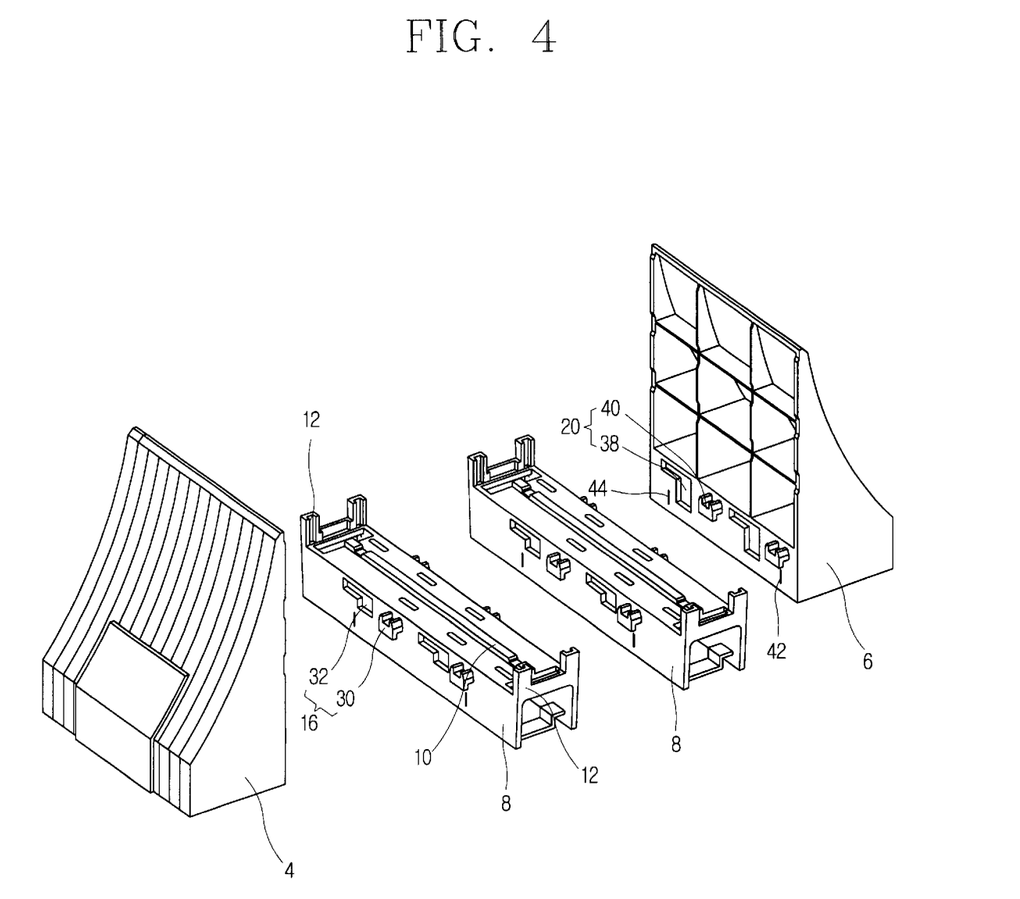
FIG. 4 is an exploded perspective view viewed from the right side of the module holder of FIG. 3.
Figure 5:
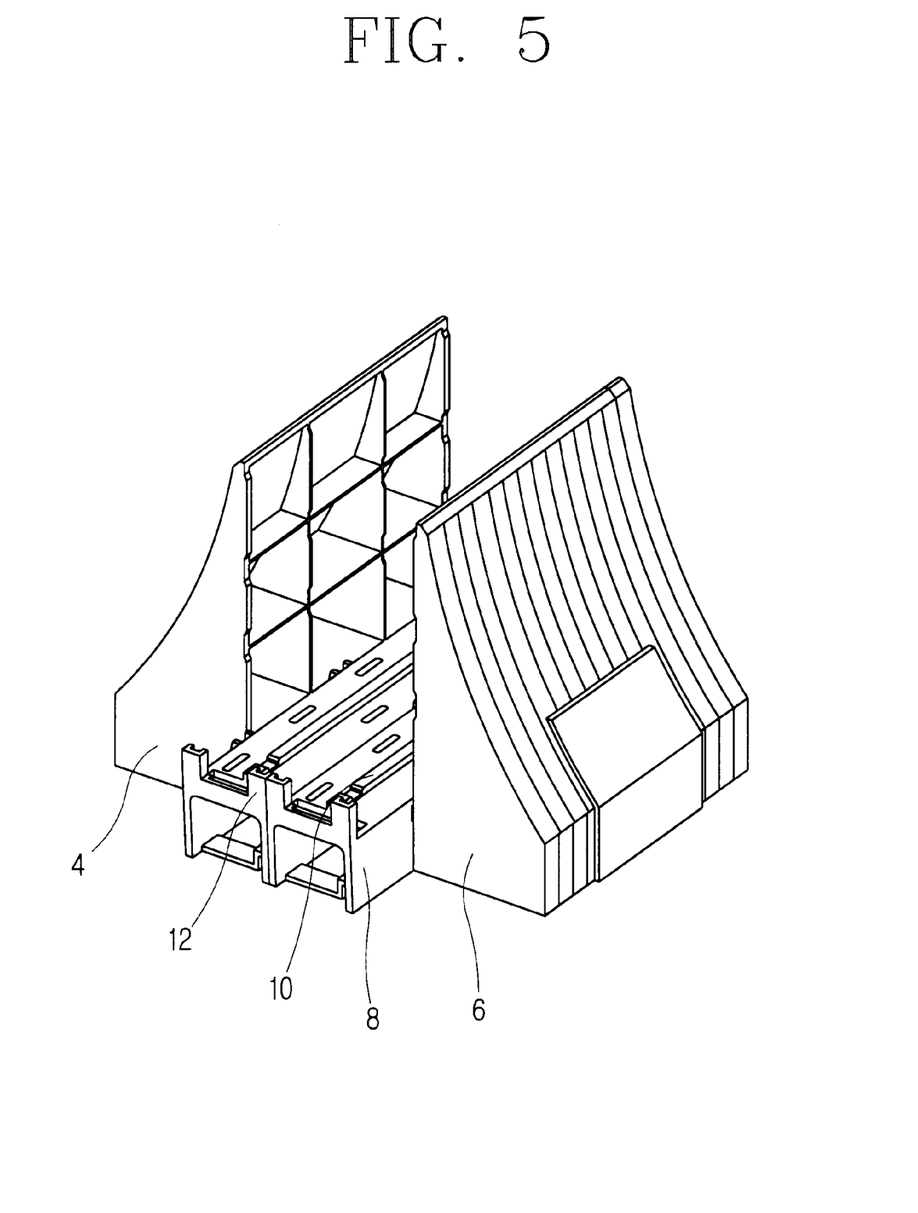
FIG. 5 is a perspective view of a holder in accordance with an embodiment of the invention.
Figure 6:
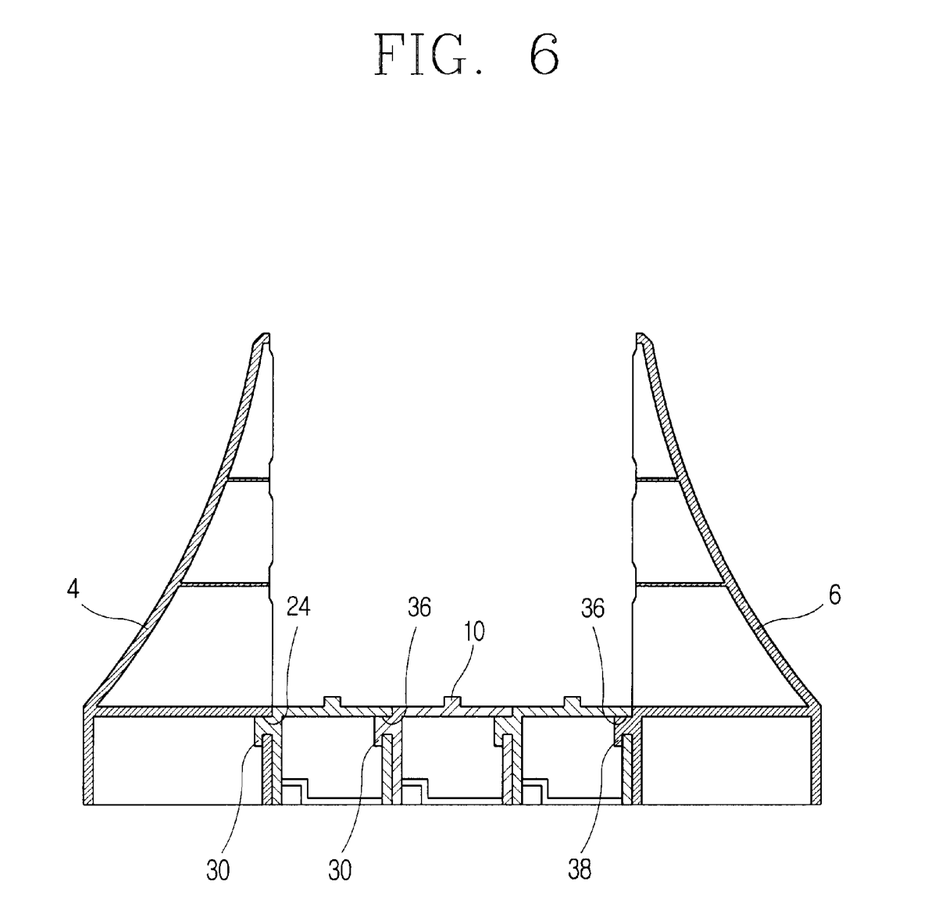
FIG. 6 is a cross-sectional view of the module holder of FIG. 5.

FIG. 3 is an exploded perspective view viewed from the left side of a module holder in accordance with an embodiment of the invention. FIG. 4 is an exploded perspective view viewed from the right side of the module holder of FIG. 3. FIG. 5 is a perspective view of a module holder in accordance with an embodiment of the invention. FIG. 6 is a cross-sectional view of the module holder of FIG. 5.

The module holder according to an embodiment of the invention includes a first foot 4 for supporting one side of a module 2, a second foot 6 for supporting the other side of the module 2, slots 8 configured to be detachably assembled between the first foot 4 and the second foot 6, and providing as many as there are modules to be mounted therein, and an engaging unit for detachably engaging the first foot 4 and the slot 8, the slot 8 and the slot 8, and the slot 8 and the second foot 6.

The first foot 4 and the second foot 6 are disposed on both sides of the slot(s) 8. The first foot 4 and the second foot 6 may be formed in such a manner that one side thereof, which supports the module 2, is planar and the other side is sloped gradually widening toward the bottom so as to stably support the module 2.

The slot 8 may have a rectangular shape, as shown in FIG. 3, corresponding to the module shape, with an inner cavity having a lower portion opened. Other shapes may also be appropriate for the slots. The slot 8 may have a width at least as thick as the mounted module 2, and may include a guide protrusion 10, which is configured to guide the module 2 as it is mounted in a longitudinal direction, at an upper central portion, and a support portion 12 protruding in an upward direction from both end portions and supporting the front and rear sides of the module 2.

Common buses may be provided between the slots 8 so that the common bus can be electrically connected to the modules 2 mounted in the slots 8. The common buses of each slot 8 may be connected to each other.

The engaging unit may include a first engaging portion 14 formed at the inner side of the first foot 4, as shown in FIG. 3, detachably engageable with one side of the slot 8. A second engaging portion 16, as shown in FIG. 4, may be formed at one side of the slot 8 detachably engageable with the first engaging portion 14. A third engaging portion 18, as shown in FIG. 3, may be formed at the other side of the slot 8 detachably engageable with the second foot 6 or with the second engaging portion 16. A fourth engaging portion 20, as shown in FIG. 4, may be formed at an inner side of the second foot 6 detachably engageable with the third engaging portion 18.

The first engaging portion 14 may include a plurality of hooks 24 formed protruding at regular intervals in a longitudinal direction of the slot 8 at the side of the first foot 4 that contacts the slot 8, and engaging holes 22 formed adjacent to the hooks 24. The hook 24 may be formed in such a manner that it protrudes at a right angle from the side face of the first foot 4 and then extends downwardly from the end portion. The engaging hole 22 may include an insertion portion 26 into which the hook 24 is configured to be inserted and a hooking portion 28, which extends with a reduced area from the insertion portion 26, into which the hook 24 is inserted.

The second engaging portion 16 may include an engaging hole 32 and a hook 30 formed at one side of the slot 8 and configured to mate with the hook 24 and the engaging hole 24 of the first engaging portion. The engaging hole 32 and hook 30 of the second engaging portion 16 may be similar in shape and structure to engaging hole 22 and hook 24 of the first engaging portion 14. In this respect, the hook 30 and the engaging hole 32 of the second engaging portion 16 are alternately formed so as to mate with the hook 24 and the engaging hole 22 of the first engaging portion 14.

The third engaging portion 18 may include a hook 36 and an engaging hole 34 formed at the other side of the slot 8, and may be similar in shape and structure to the hook 24 and the engaging hole 22 of the first engaging portion 14. As the second engaging portion 16 and the third engaging portion 18 are mutually engageable the slots 8 can be increased in number as many as desired.

The fourth engaging portion 20 may include an engaging hole 38 and a hook 40 which are formed at an inner side of the second foot 6 and which are configured to mate with the hook 36 and the engaging hole 34 of the third engaging portion 18. The engaging hole 38 and the hook 40 of the fourth engaging portion 20 may be similar in shape and structure to the hook 30 and the engaging hole 32 of the second engaging portion.

A fixing unit may be formed between the first foot 4 and the slot 8, between the adjacent slots 8, and between the slot 8 and the second foot 6, to fix the assembled position of each component. The position fixing unit may include a position fixing protrusion 42 and a position fixing groove 44 formed at both inner ends of the first foot 4 and the second foot 6 and also formed at both end portions of both sides of the slot 8, so as to be insertedly combined to each other to fix the assembled position when parts are assembled. That is, the position fixing groove 44 and the position fixing protrusion 42 of the position fixing unit are insertedly combined to fix the assembled positions of the parts when the first foot 4 and the slot 8 are assembled, the adjacent slots 8 are assembled, and the second foot 6 and the slot 8 are assembled.

The operation of the module holder constructed as described above will now be explained.

First, the assembly of the first foot 4 and the slot 8 will now be described.

The hook 30 of the second engaging portion 16 is inserted into the insertion portion 26 of the engaging hole 22 of the first engaging unit 14 and the hook 24 of the first engaging portion 14 is inserted into the insertion portion 26 of the engaging hole 32 of the second engaging portion 16. In this state, when a force is applied to the first foot 4 and the slot 8 in mutually opposite directions, both hooks 24 and 30 are insertedly assembled to the engaging portion 28 of the respective engaging holes 22 and 32, so that both sides are fixed. At this time, the position fixing groove 44 and the position fixing protrusion 42 respectively formed on the first foot 4 and the slot mate, so that the assembled positions of the first foot 4 and the slot 8 are fixed.

The slots 8 are assembled as many as are necessary, corresponding to the number of modules to be mounted. Namely, the engaging holes and the hooks of the second engaging portion 16 and the third engaging portion 18 formed at both sides of the slot 8 are assembled, thereby fixing the slots 8 to one another. At this time, the position fixing groove 44 and the position fixing protrusion 42 formed between the slots 8 mate to thereby fix the assembled positions of the slots 8.

Then, the slot 8 and the second foot 6 are assembled. Namely, the engaging hole 34 and the hook 36 of the third engaging portion 18 formed on the slot 8 and the engaging hole 38 and the hook 40 of the fourth engaging portion 20 formed on the second foot 6 are insertedly assembled to thereby fix the slot 8 and the second foot 6 with respect to one another. Also, at this time, the position fixing groove 44 and the position fixing protrusion 42 formed respectively between the slot 8 and the second foot 6 mate to thereby fix the assembled positions of the slot 8 and the second foot 6.

When the module holder assembly is completed, modules are mounted starting from an upper side to the lower side of the module holder. At this time, the modules are electrically connected by the common bus.

Figure 7:
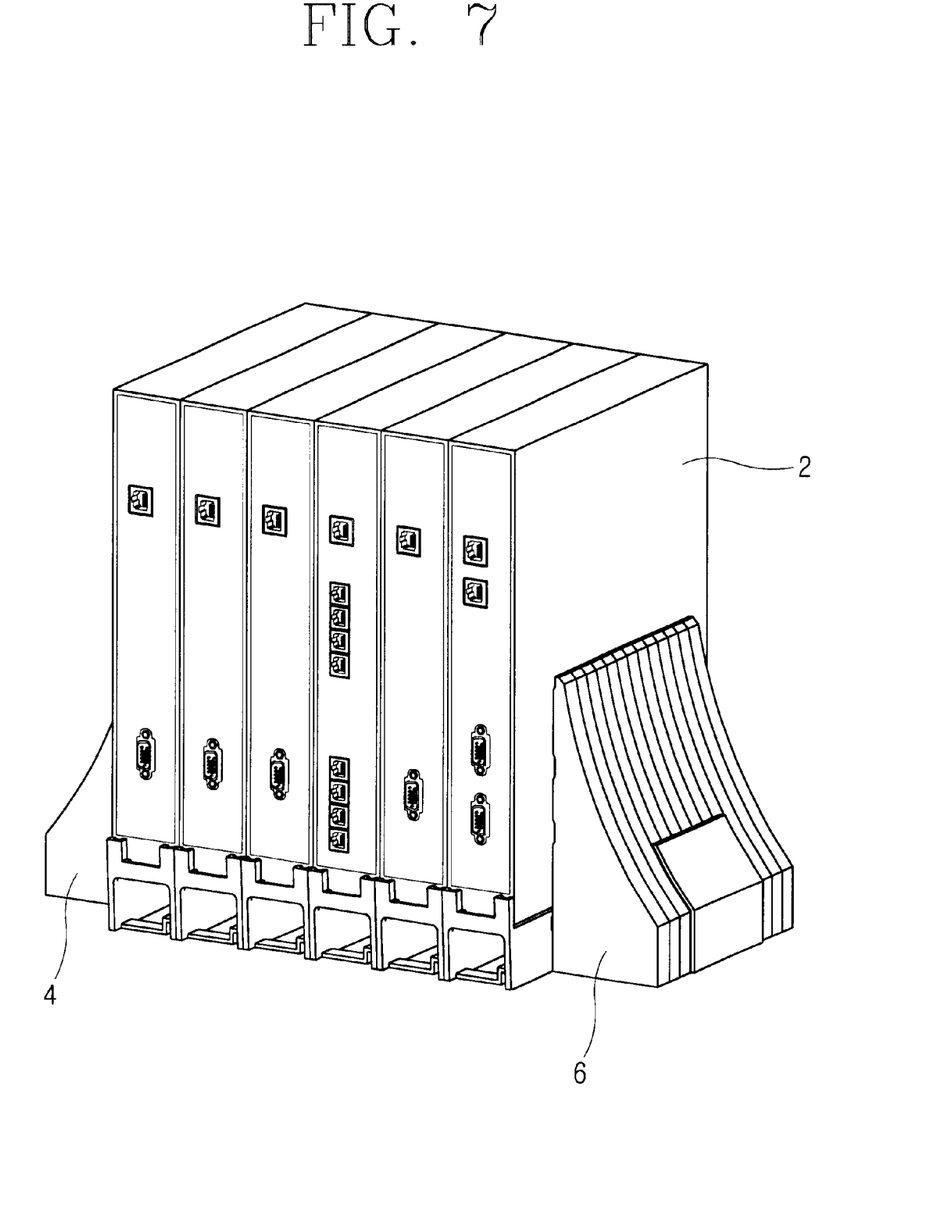
FIG. 7 is a perspective view showing a state in which a module is mounted in the module holder in accordance with an embodiment of the invention.
Figure 8:
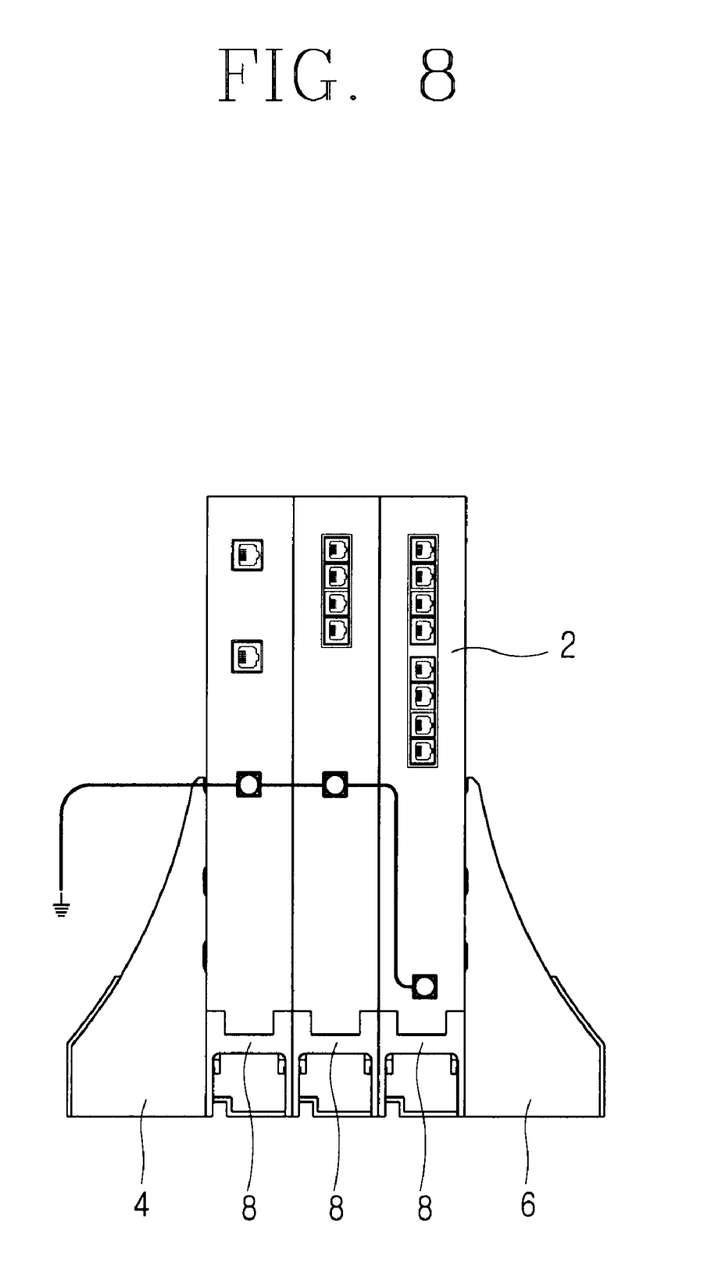
FIG. 8 is a side view showing a state in which module is mounted in the module holder in accordance with an embodiment of the invention.

FIG. 7 is a perspective view showing a state in which a module is mounted in the module holder in accordance with an embodiment of the invention. FIG. 8 is a side view showing a state in which a module is mounted in the module holder in accordance with an embodiment of the invention.

As so far described, the module holder according to the invention has many advantages, including but not limited to those advantages discussed below. For example, since the slots are formed as single products and engaging portions are formed between the slots, the slots can be separated or engaged. Thus, as many slots as are necessary can be assembled corresponding to the number of modules to be mounted and the number can be easily be increased if additional modules are needed. Accordingly, the space module holder occupying equipment can be minimized, improving the space utilization of the equipment.

In addition, when the module is mounted in the slot, since both sides of the module are supported by the first foot, the second foot, and/or the slot, and the front and rear sides of the module are supported by the support portion 12 formed on the slot, they can be stably fixed against external impact.

The invention can be used for detachably providing a module in various equipment. The module holder according to the invention is capable of varying a size of a holder according to the number of modules to effectively utilize a space of equipment and reduce a manufacturing cost, by increasing the number of slots according to the number of modules and maintaining the number of slots the same as the number of modules.

The foregoing embodiments and advantages are merely exemplary and are not to be construed as limiting the invention. The present teaching can be readily applied to other types of apparatuses. The description of the invention is intended to be illustrative, and not to limit the scope of the claims. Many alternatives, modifications, and variations will be apparent to those skilled in the art. In the claims, means-plus-function clauses are intended to cover the structures described herein as performing the recited function and not only structural equivalents but also equivalent structures.

What is claimed is:

1. A module holder, comprising:
    a first foot for supporting one side of a module;
    a second foot for supporting another side of a module;
    at least one slot configured to be detachably assembled between the first foot and the second foot; and
    an engaging unit integrally formed with the first foot, both sides of the at least one slot and the second foot and configured to detachably attach the first foot and the at least one slot, and the at least one slot and the second foot, respectively.

2. The module holder of claim 1, wherein the at least one slot comprises a plurality of slots.

3. The module holder of claim 2, wherein the engaging unit is configured to detachably attach together the first foot and one of the plurality of slots, adjacent slots, and one of the plurality of slots and the second foot.

4. The module holder of claim 3, wherein the engaging unit includes a plurality of hooks and engaging holes formed to be mutually engaged between the first foot and a slot disposed adjacent thereto, between adjacent slots, and between the second foot and a slot disposed adjacent thereto.

5. The module holder of claim 4, wherein each hook protrudes at a right angle from an inner side of the respective first foot, second foot, and both sides of the respective slot and is bent at a right angle downwardly from the end portion.

6. The module holder of claim 4, wherein each engaging hole includes an insertion portion in which a hook is inserted and a hooking portion, smaller than the insertion portion, into which a hook is engaged, and is formed on an inner side of the respective first foot, second foot and both sides of the respective slot.

7. The module holder of claim 2, further comprising:
    a position fixing unit configured to fix an assembled position of the first foot, the second foot, and the plurality of slots when assembled.

8. The module holder of claim 7, wherein the position fixing unit includes a plurality of position fixing protrusions and a plurality of position fixing grooves that are configured to mate with one another between the respective first foot, second foot, and the respective slots to fix the assembled position of each of the parts when assembled.

9. The module holder of claim 2, wherein the plurality of slots comprise a number of slots corresponding to a number of modules to be mounted in the module holder.

10. The module holder of claim 2, wherein sides of the first foot and the second foot facing the plurality of slots are planar so as to support a module or modules, while opposite sides of the first foot and the second foot are sloped toward the bottom so as to stably support a module or modules.

11. The module holder of claim 2, wherein each of the plurality of slots includes a guide protrusion formed at an upper central portion thereof configured to guide a module when mounted therein and a support portion configured to support front and rear side faces of a module.

12. The module holder of claim 1, wherein the number of slots provided corresponds to the number of modules to be supported in the module holder.

13. The module holder of claim 1, further comprising:
    a position fixing unit provided between the first foot and the at least one slot, and between the at least one slot and the second foot, so as to fix an assembly position when they are assembled by the engaging unit.

14. The module holder of claim 1, wherein the first foot and the second foot are each configured such that one side thereof, which is configured to support a module, is planar and the other side is sloped toward a bottom portion so as to stably support the module.

15. The module holder of claim 1, wherein the slot has a width as thick as a module to be mounted therein.

16. The module holder of claim 1, wherein the at least one slot includes a guide protrusion formed at an upper central portion thereof and configured to guide a module as it is mounted therein and a support portion which protrudes in an upward direction from both end portions of the at least one slot and which supports the front and rear sides of a module.

17. The module holder of claim 1, wherein the module holder holds at least one module comprising an electronic device having a prescribed dimension.

18. The module holder of claim 17, wherein the at least one slot has a dimension to be in contact with one entire side of the module.

19. The module holder of claim 1, wherein the at least one slot extends substantially horizontally.

20. A module holder, comprising:
    a first foot for supporting one side of a module;
    a second foot for supporting another side of a module;
    at least one slot configured to be detachably assembled between the first foot and the second foot; and
    an engaging unit configured to detachably attach together the first foot and the at least one slot, and the at least one slot and the second foot, wherein the engaging unit comprises:
        a first engaging portion formed on an inner side of the first foot;
        a second engaging portion formed at one side of the at least one slot and configured to be detachably engaged with the first engaging portion;
        a third engaging portion formed at the other side of the at least one slot; and
        a fourth engaging portion formed at an inner side of the second foot and configured to be detachably engaged with the third engaging portion.

21. The module holder of claim 20, wherein the first engaging portion comprises a plurality of hooks that protrude at regular intervals in a longitudinal direction of the slot on a side of the first foot that contacts the at least one slot, and engaging holes formed between the hooks.

22. The module holder of claim 21, wherein the second engaging portion comprises a plurality of hooks on one side of the at least one slot, which are configured to mate with the engaging holes of the first engaging portion, and engaging holes formed between the hooks, which are configured to mate with the hooks of the first engaging portion.

23. The module holder of claim 22, wherein the third engaging portion is configured to have the same structure as the first engaging portion, and the fourth engaging portion is configured to have the same structure as the second engaging portion.

24. The module holder of claim 23, wherein the hooks protrudes at a right angle from an inner side of the first foot, the second foot, both sides of the at least one slot and are bent at a right angle downwardly from the end portion, and the engaging hole includes a large insertion portion into which the hook is inserted and a small hooking portion smaller that the insertion portion into which the hook is engaged.

25. The module holder of claim 20, wherein the at least one slot extends substantially horizontally.

26. A module holder, comprising:

a first foot for supporting one side of a module;

a second foot for supporting another side of a module;

at least one slot configured to be detachably assembled between the first foot and the second foot; and a position fixing unit provided between the first foot and the at least one slot, and between the at least one slot and the second foot, so as to fix an assembly position when they are assembled by the engaging unit, wherein the position fixing unit includes a position fixing protrusion and position fixing groove that are configured to mate with one another and formed between the first foot, the second foot, and the at least one slot when assembled.

27. The module holder of claim 26, wherein the at least one slot extends substantially horizontally.

* * * * *